United States Patent
Holber et al.

(10) Patent No.: US 10,443,150 B2
(45) Date of Patent: Oct. 15, 2019

(54) TOROIDAL PLASMA PROCESSING APPARATUS WITH A SHAPED WORKPIECE HOLDER

(71) Applicant: Plasmability, LLC, Austin, TX (US)

(72) Inventors: William Holber, Winchester, MA (US); Robert J. Basnett, Austin, TX (US)

(73) Assignee: Plasmability, LLC, Austin, TX (US)

( * ) Notice: Subject to any disclaimer, the term of this patent is extended or adjusted under 35 U.S.C. 154(b) by 634 days.

(21) Appl. No.: 15/155,599

(22) Filed: May 16, 2016

(65) Prior Publication Data

US 2016/0340798 A1    Nov. 24, 2016

Related U.S. Application Data

(60) Provisional application No. 62/165,148, filed on May 21, 2015.

(51) Int. Cl.
*C30B 25/10* (2006.01)
*H01J 37/32* (2006.01)
(Continued)

(52) U.S. Cl.
CPC .......... *C30B 25/105* (2013.01); *C23C 16/272* (2013.01); *C23C 16/455* (2013.01);
(Continued)

(58) Field of Classification Search
CPC combination set(s) only.
See application file for complete search history.

(56) References Cited

U.S. PATENT DOCUMENTS 5,435,900 A    7/1995  Gorokhovsky
5,505,780 A *  4/1996  Dalvie .................. C23C 16/511
                                                118/723 I
(Continued)

FOREIGN PATENT DOCUMENTS

CN          1723529 A     1/2006
CN        101189684 A     5/2008
(Continued)

OTHER PUBLICATIONS

Notification Concerning Transmittal of International Preliminary Report on Patentability(Chapter I of the Patent Cooperation Treaty) for PCT/US2014/027881, dated Sep. 24, 2015, 10 Pages, The International Bureau of WIPO, Geneva, Switzerland.

(Continued)

*Primary Examiner* — Erin F Bergner
(74) *Attorney, Agent, or Firm* — Kurt Rauschenbach; Rauschenbach Patent Law Group, LLC

(57) ABSTRACT

A plasma processing apparatus includes a toroidal-shape plasma vessel comprising a process chamber. A magnetic core surrounds a portion of the toroidal-shape plasma vessel. An RF power supply having an output that is electrically connected to the magnetic core energizes the magnetic core, thereby forming a toroidal plasma loop discharge in the plasma chamber. A workpiece holder is positioned in the toroidal-shape plasma vessel and includes at least one face. A plasma guiding structure is shaped and dimensioned so as to constrain a section of plasma in the toroidal plasma loop to travel substantially perpendicular to a normal to the at least one face.

54 Claims, 9 Drawing Sheets

(51) Int. Cl.

| | | |
|---|---|---|
| *C30B 25/12* | (2006.01) | |
| *C30B 25/16* | (2006.01) | |
| *C23C 16/27* | (2006.01) | |
| *C23C 16/455* | (2006.01) | |
| *C23C 16/458* | (2006.01) | |
| *C30B 29/04* | (2006.01) | |
| *C23C 16/46* | (2006.01) | |
| *C23C 16/505* | (2006.01) | |
| *C30B 25/14* | (2006.01) | |

(52) U.S. Cl.
CPC .......... *C23C 16/458* (2013.01); *C23C 16/463* (2013.01); *C23C 16/505* (2013.01); *C30B 25/12* (2013.01); *C30B 25/16* (2013.01); *C30B 29/04* (2013.01); *H01J 37/321* (2013.01); *H01J 37/3244* (2013.01); *H01J 37/3266* (2013.01); *C30B 25/14* (2013.01)

(56) References Cited

U.S. PATENT DOCUMENTS

| | | | |
|---|---|---|---|
| 6,150,628 | A | 11/2000 | Smith et al. |
| 6,238,588 | B1 | 5/2001 | Collins et al. |
| 6,388,226 | B1 | 5/2002 | Smith et al. |
| 6,392,351 | B1 | 5/2002 | Shun'ko |
| 6,433,260 | B1 | 8/2002 | Anderson |
| 6,486,431 | B1 | 11/2002 | Smith et al. |
| 6,552,296 | B2 | 4/2003 | Smith et al. |
| 6,559,408 | B2 | 5/2003 | Smith et al. |
| 6,664,497 | B2 | 12/2003 | Smith et al. |
| 6,815,633 | B1 | 11/2004 | Chen et al. |
| 6,924,455 | B1 | 8/2005 | Chen et al. |
| 6,927,358 | B2 | 8/2005 | Gonzales et al. |
| 7,161,112 | B2 | 1/2007 | Smith et al. |
| 7,166,816 | B1 | 1/2007 | Chen et al. |
| 7,541,558 | B2 | 6/2009 | Smith et al. |
| 7,569,790 | B2 | 8/2009 | Holber et al. |
| 8,124,906 | B2 | 2/2012 | Holber et al. |
| 8,779,322 | B2 | 7/2014 | Holber et al. |
| 2002/0157703 | A1 | 10/2002 | Cox et al. |
| 2002/0157793 | A1 | 10/2002 | Cox et al. |
| 2002/0179250 | A1 | 12/2002 | Veltrop et al. |
| 2004/0079287 | A1 | 4/2004 | Smith et al. |
| 2005/0000655 | A1 | 1/2005 | Wi |
| 2005/0136604 | A1 | 6/2005 | Al-Bayati et al. |
| 2013/0118589 | A1 | 5/2013 | Hu et al. |
| 2014/0062285 | A1 | 3/2014 | Chen |
| 2014/0272108 | A1 | 9/2014 | Holber et al. |
| 2015/0075431 | A1 | 3/2015 | Barriss et al. |

FOREIGN PATENT DOCUMENTS

| | | | |
|---|---|---|---|
| CN | 101939812 | A | 1/2011 |
| EP | 1831425 | B1 | 7/2011 |
| JP | 09-04597 | | 2/1997 |
| JP | H11157991 | A | 6/1999 |
| JP | 2002-525866 | A | 8/2002 |
| JP | 2003-506888 | A | 2/2003 |
| JP | 2003506888 | A | 2/2003 |
| JP | 2004506339 | A | 2/2004 |
| JP | 2005-116691 | A | 4/2005 |
| JP | 2005236063 | A | 9/2005 |
| JP | 2006-24442 | A | 1/2006 |
| JP | 2008540849 | A | 11/2008 |
| JP | 201215115 | A | 8/2012 |
| JP | 2013503430 | A | 1/2013 |
| JP | 2013-168675 | A | 8/2013 |
| JP | 2015-88573 | A | 5/2015 |
| KR | 10-2006-0092427 | A | 8/2006 |
| TW | 201331979 | A | 8/2013 |
| TW | 201331979 | A1 | 8/2013 |
| TW | 201415524 | A | 4/2014 |
| TW | 201501775 | A | 1/2015 |
| WO | 01/11650 | A1 | 2/2001 |
| WO | 2004022821 | A1 | 3/2004 |
| WO | 2004046427 | A1 | 6/2004 |
| WO | 2012084660 | A1 | 6/2012 |
| WO | 2014/143775 | A1 | 9/2014 |
| WO | 2014-152908 | | 9/2014 |
| WO | 2014152908 | A1 | 9/2014 |

OTHER PUBLICATIONS

"Supplementary European Search Report" for European Patent Application No. 14763433.1, Jul. 11, 2016, 8 pages, European Patent Office, Munich, Germany.

Notification of Transmittal of International Search Report and the Written Opinion of the International Searching Authority or the Declaration for PCT/US2014/027881, dated Aug. 6, 2014, 14 Pages, The International Searching Authority/KR, Daejeon Metropolitan City, Republic of Korea.

Notification of Transmittal of International Search Report and the Written Opinion of the International Searching Authority or the Declaration for PCT/US2016/032799, dated Aug. 23, 2016, 12 Pages, The International Searching Authority/KR, Daejeon Metropolitan City, Republic of Korea.

"Notification Concerning Transmittal of International Preliminary Report on Patentability (Chapter I of the Patent Cooperation Treaty)", for International Application No. PCT/US2016/032799, dated Nov. 30, 2017, 8 Pages, The International Bureau of WIPO, Geneva, Switzerland.

"Office Action" for Chinese Patent No. 201480014623.2, dated Feb. 1, 2018, 8 pages, State Intellectual Property Office of the People's Republic of China, China.

"Office Action" for Japanese Patent Application No. 2016-502655, dated Nov. 21, 2017, 5 pages, Japanese Patent Office, Japan.

"Office Action" for Chinese Patent Application No. 201480014623. 2, dated Jun. 19, 2017, 9 pages, State Intellectual Property Office of the People's Republic of China, China.

"Office Action" for Chinese Patent Application No. 201480014623. 2, dated Aug. 29, 2016, 17 pages, State Intellectual Property Office of the People's Republic of China, Beijing, China.

Notice of Allowance for Taiwanese Patent Application No. 105115721, dated Jun. 8, 2017, 3 pages, Taiwanese Patent Office, Taiwan.

Zvanya et al, Toroidal Plasma Enhanced CVD of Diamond Films, Journal of Vacuum Science and Technology: Part A, Sep. 1, 2014, 6 pages, vol. 32, No. 5, American Vacuum Society, Melville, NY, US.

"Search Report" for European Patent Application No. 16797127.4, 10 pages, dated Nov. 16, 2018, European Patent Office, Munich, Germany.

"Office Action" for Taiwanese Patent Application No. 106123204, dated May 16, 2018, 4 pages, Taiwan Intellectual Property Office, Taiwan.

"Office Action" for Taiwanese Patent Application No. 106123204, dated Dec. 21, 2018, 8 pages, Taiwan Intellectual Property Office, Taiwan.

"Office Action" for Chinese Patent Application No. 201680036668. 9, dated Jan. 31, 2019, 10 pages, State Intellectual Property Office of the People's Republic of China, Beijing, China.

"Notice of Eligibility for Grant" for Singapore Patent Application No. 11201709365P, dated Feb. 25, 2019, 2 pages, Intellectual Property Office of Singapore, Singapore.

"Supplementary Examination Report" for Singapore Patent Application No. 11201709365P, dated Feb. 2, 2019, 2 pages, Intellectual Property Office of Singapore, Singapore.

"Notification Prior to Examination" for Israeli Patent Application No. 255356, dated Mar. 17, 2019, 2 pages, Israeli Patent Office.

"Office Action" for Japanese Patent Application No. 2017-560239, dated Jul. 18, 2019, 10 pages, Japanese Patent Office.

* cited by examiner

TOROIDAL PLASMA PROCESSING APPARATUS WITH A SHAPED WORKPIECE HOLDER

The section headings used herein are for organizational purposes only and should not to be construed as limiting the subject matter described in the present application in any way.

CROSS REFERENCE TO RELATED APPLICATION

The present application is a non-provisional application of U.S. Provisional Patent Application No. 62/165,148 entitled "Toroidal Plasma Processing Apparatus with a Shaped Workpiece Holder" filed on May 21, 2015. The entire contents of U.S. Provisional Patent Application No. 62/165,148 are herein incorporated by reference.

INTRODUCTION

There are many types of plasma discharges and they operate under a wide range of conditions. In some applications, pressures as low as $10^{-3}$ Torr are used. At low pressure, dissociation mainly occurs due to electron impact on molecules. Heating of the gaseous species plays a relatively minor role in the dissociation processes. In other applications, much higher gas pressures are used that can be from 1 Torr to greater than 1 atm. Dissociation of molecules occurs due to a combination of electron impact plus heating of the gaseous species. Generally, the most efficient dissociation occurs when the pressure and gas temperature are both relatively high. Gas temperatures can exceed several thousand degrees Centigrade when the gas pressure is 1 Torr or greater and the electrical power absorbed in the plasma is greater than 10 W $cm^{-3}$. At these high gas temperatures, thermal effects begin to play an important role in maintaining a highly dissociated gas.

BRIEF DESCRIPTION OF THE DRAWINGS

The present teaching, in accordance with preferred and exemplary embodiments, together with further advantages thereof, is more particularly described in the following detailed description, taken in conjunction with the accompanying drawings. The person skilled in the art will understand that the drawings, described below, are for illustration purposes only. The drawings are not necessarily to scale, emphasis instead generally being placed upon illustrating principles of the teaching. The drawings are not intended to limit the scope of the Applicants' teaching in any way.

DESCRIPTION OF VARIOUS EMBODIMENTS

Figure 1:
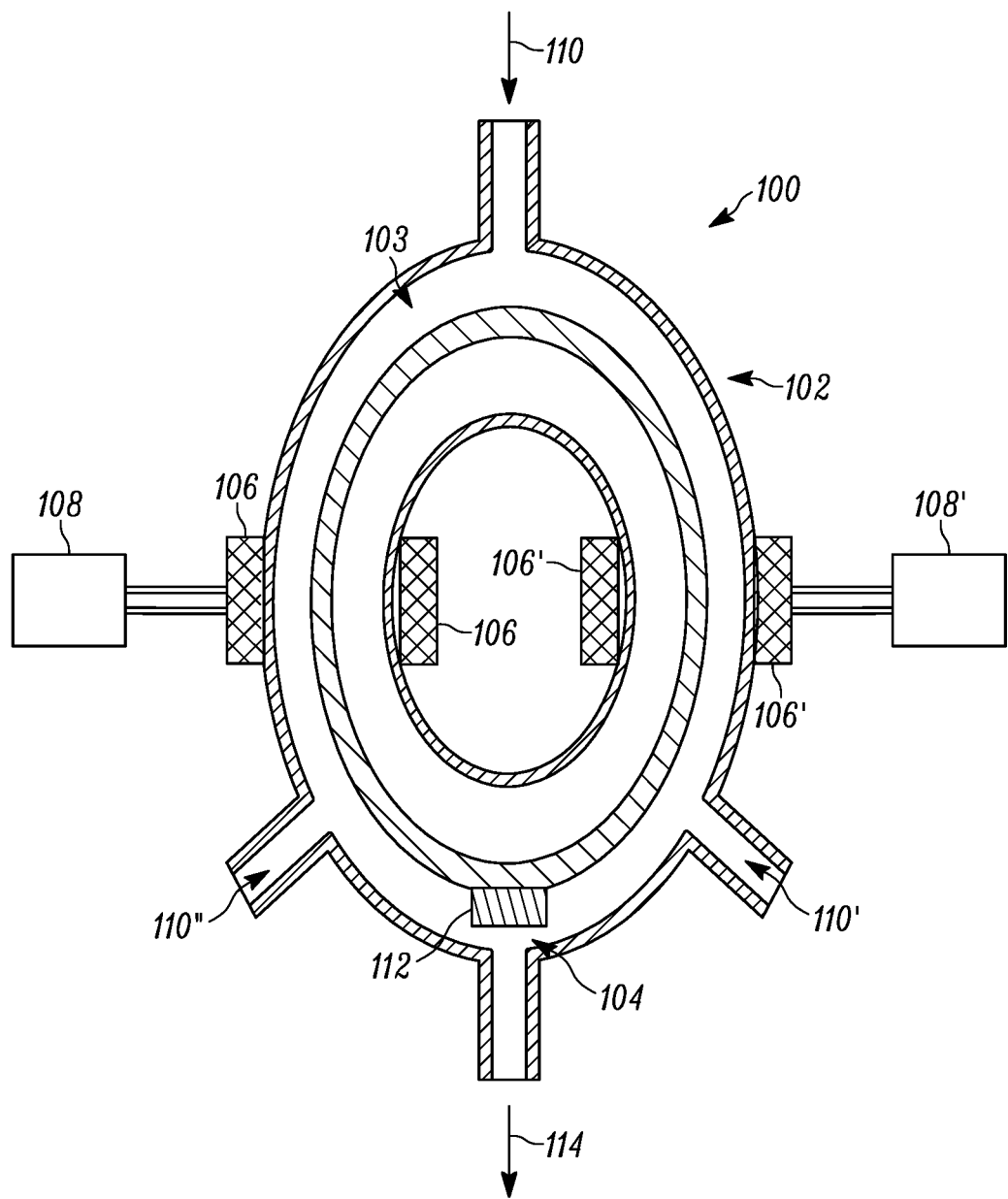
FIG. 1 illustrates a toroidal plasma source according to one embodiment of the present teaching having at least one magnetic core and at least one power supply where inert and process gases can be introduced at one point or at multiple points.

Reference in the specification to "one embodiment" or "an embodiment" means that a particular feature, structure, or characteristic described in connection with the embodiment is included in at least one embodiment of the teaching. The appearances of the phrase "in one embodiment" in various places in the specification are not necessarily all referring to the same embodiment.

It should be understood that the individual steps of the methods of the present teaching may be performed in any order and/or simultaneously as long as the teaching remains operable. Furthermore, it should be understood that the apparatus and methods of the present teaching can include any number or all of the described embodiments as long as the teaching remains operable.

The present teaching will now be described in more detail with reference to exemplary embodiments thereof, as shown in the accompanying drawings. While the present teaching is described in conjunction with various embodiments and examples, it is not intended that the present teaching be limited to such embodiments. On the contrary, the present teaching encompasses various alternatives, modifications, and equivalents, as will be appreciated by those of skill in the art. Those of ordinary skill in the art having access to the teaching herein will recognize additional implementations, modifications, and embodiments, as well as other fields of use, which are within the scope of the present disclosure as described herein.

The present teaching generally relates to using plasma discharges in order to dissociate molecular gases for the purpose of depositing various materials. One aspect of the apparatus and methods of the present teaching relates to forming diamond, diamond-like carbon, graphene, and related materials using plasma discharges for dissociating molecular gases. Some of these materials are sometimes generally referred to as "synthetic diamond" or "lab-grown diamond." Synthetic diamond materials can be grown in various forms including single crystal materials, polycrystalline materials, and nanocrystalline materials. These synthetic diamond materials have many uses including use in cutting tools, abrasives, windows for transmitting radiation from the UV into the IR, laser optics, spectrometer optics, quantum computing, heat sinks, gems, electronic devices, electrochemical devices, and heat sinks.

Synthetic diamond materials have been produced for many years by a variety of means. Early synthetic diamond processing techniques include thermal torches and high pressure, high temperature reactors. Beginning in the 1980's, investigators began looking at plasma techniques to generate synthetic diamond films. These were typically thin or thick films of diamond material that were deposited onto substrates, such as silicon, tungsten, and molybdenum.

The plasma reactors used to form the synthetic diamond are generally classified as plasma chemical vapor deposition reactors, which are also known as Plasma CVD or PCVD reactors. Much of the initial development of Plasma CVD diamond deposition has been performed using microwave plasma-based reactors operating in the general pressure range of 10-100 Torr. Other synthetic diamond deposition has been performed using lower pressure plasma reactors and non-microwave plasma generators. In general, higher-quality films and higher deposition rates have been obtained using the higher pressure microwave plasma systems. See, for example, J. E. Butler, Y. A. Mankelevich, A. Cheesman, Jie Ma and M. N. R. Ashfold, "Understanding the Chemical Vapor Deposition of Diamond: Recent Progress", Journal of Physics: Condensed Matter 21 (2009) 364201, IOP Publishing. See also, F. Silva, K. Hassouni, X. Bonnin and A. Gicquel, "Microwave Engineering of Plasma-Assisted CVD Reactors for Diamond Deposition," Journal of Physics: Condensed Matter 21 (2009) 364202 IOP Publishing. All the references cited herein including J. E. Butler et al., and F. Silva et al. are herein incorporated by reference.

The plasma chemistry for depositing diamond, diamond-like carbon, graphene, and related materials includes mainly hydrogen chemistry with the addition of a small amount of a carbon-containing gas, such as methane or acetylene. Other gases containing carbon and hydrogen may also be used. In addition, other gases can be added, such as nitrogen, oxygen, or a halogen species, to achieve diamond materials with certain properties. For example, to grow diamond materials suitable for certain electronic, electrochemical, and sensor applications, it is desirable to add dopant gases during growth that modify the electronic, optical, and other properties of the deposited diamond material. Examples of dopants that have been introduced in gaseous form include boron, phosphorous, silicon, lithium, and sodium. These and other dopant gasses can be used to modify the electrical and/or optical characteristics of the diamond material. For example, some of these dopant gases can be used to add color to the diamond material.

The plasma dissociates some fraction of the hydrogen as well as the carbon-containing species. Atomic hydrogen is a critical ingredient because it adsorbs onto the growing diamond surface and also preferentially etches away non-diamond-bonds in favor of diamond bonds. The key to both high deposition rates and high quality film growth is to have a high flux of atomic hydrogen at the workpiece surface. The term "workpiece" is defined herein to be the object on which material is being deposited. In other words, the workpiece is the sample or device being processed according to the methods and apparatus of the present teachings.

Many types of plasma discharges generate the conditions necessary for high flux of atomic hydrogen. However, most of these plasma discharges show significant disadvantages for practical applications. For example, plasma torches operating at atmospheric pressure can generate very high gas temperatures and are very effective in dissociating a variety of molecular gases. However, the torch electrodes have limited lifetimes. Also, erosion of plasma torch electrodes generates contamination that is unacceptable for many applications. In addition, it is difficult for plasma torches to generate uniform discharges over large areas.

Inductive RF plasma sources are commonly used in semiconductor processing equipment and can be used to generate a high flux of atomic hydrogen. Inductive RF plasma sources operate at frequencies that are typically between 2 MHz and 60 MHz. However, as the power density and/or pressure are raised, serious plasma chamber erosion can occur. The desired high plasma density and gas pressure that is used for efficiently generating a high flux of atomic hydrogen is difficult to attain in traditional inductive plasma sources. Also, power supplies and impedance matching units used to drive inductively coupled plasmas are typically not very efficient. Furthermore, there are significant coupling losses between the power supply and the plasma that add to the inefficiencies. Compensating for these losses substantially adds to the cost and complexity of the Plasma CVD system because relatively large power supplies are needed that consume relatively large amounts of power and because these systems typically require cooling. The larger power supplies and cooling apparatus also significantly add to the clean room space required for these apparatus making them very expensive to operate.

Microwave plasma discharge sources are also commonly used to generate a high flux of atomic hydrogen for depositing diamond. In these reactors, the typical gaseous species include hydrogen and a carbon-containing gas, such as methane, and may include quantities of other gases, such as oxygen, nitrogen, and halogen species. Carbon-containing species other than methane have also been used. These microwave discharge sources operate at pressures ranging from less than $10^{-3}$ Torr to greater than one atmosphere.

High performance microwave diamond CVD reactors apply a high atomic hydrogen flux to the workpiece surface using various operating parameters. For example, these microwave diamond CVD reactors can operate with relatively high pressures (10-100+ Torr) and/or relatively high neutral gas temperature (2000° C. or greater).

In many high performance microwave diamond CVD reactors, the workpiece surface is positioned at a relatively short distance from the plasma core where atomic hydrogen is generated. Having the workpiece surface at short distances from the plasma core is desirable because, at typical pressures in the process chamber, both gas-phase recombination and wall reactions will cause loss of atomic hydrogen. In many systems, the workpiece needs to be positioned less than five centimeters from the hot core of the plasma so that efficient or optimum transport of atomic hydrogen to the workpiece surface is achieved. In many systems, depending on the gas pressure, the most efficient or optimum distance from the hot core of the plasma to the workpiece surface is a millimeter or less. At these power densities and close workpiece surface distances to the plasma core, there will be significant heating of the workpiece. This heating can be advantageously used to provide the energy to the growth surface of the workpiece in order to heat the workpiece to the desired deposition temperature.

The plasma and surface chemistry in microwave plasma reactors that are commonly used to deposit diamond have been extensively studied, and it is well known that production of atomic hydrogen in the plasma and its use on the workpiece surface is critical to the process. The deposition rate and the material quality both increase as the reactor becomes more efficient at dissociating the molecular hydrogen into atomic hydrogen and more efficiently delivers the atomic hydrogen to the workpiece surface. Also, when atomic hydrogen impinges onto the workpiece surface, there is a high probability that the atomic hydrogen will recombine into molecular hydrogen, liberating a large amount of energy which will transfer to the workpiece, causing it to rise in temperature. This can be advantageous in processes which require high workpiece temperatures, such as the deposition of diamond, graphene, and similar materials. By utilizing the atomic hydrogen for workpiece heating, the need for supplemental heating can be reduced or avoided completely, reducing energy costs, equipment complexity, and equipment cost.

However, microwave generators are notoriously inefficient. Microwave generators typically have an overall efficiency of only about 50% (AC line to microwave power). In addition, the magnetron tubes in these generators typically need to be replaced on a routine basis, which significantly adds to the operating cost and reduces throughput due to significant down time of the system. In addition, specialized and costly waveguide components are needed to couple the power from the microwave generator to the plasma. The microwave coupling components and generator are also large in size and weight, which limits their practical application, especially in a clean room environment.

One aspect of the present teaching is the use of a toroidal plasma to generate atomic hydrogen that effectively and efficiently deposits a variety of materials, including diamond, diamond-like carbon, graphene, and other carbon-based materials. A toroidal plasma is defined herein as a plasma that completes a closed loop. Toroidal plasmas have been used in commercial material processing applications for several years. One known toroidal plasma apparatus for material processing is described in U.S. Pat. No. 6,150,628, which is incorporated herein by reference. Toroidal plasmas as described herein generally have one or more of the following characteristics: (1) the plasma is generated in a closed loop; (2) one or more magnetic cores surround a portion of the plasma loop; and (3) an RF power supply is connected to a primary winding of the magnetic core so that power is coupled through the magnetic core to the plasma loop, which is effectively the secondary of the transformer circuit.

Recently, toroidal plasma sources have been used to deposit diamond. See, for example, U.S. Patent Publication No. 20140272108 A1, which is assigned to the present assignee. The entire content of U.S. patent application Ser. No. 14/212,073, which was published as U.S. Patent Publication No. 20140272108 A1, is incorporated herein by reference. In these toroidal plasma sources, non-microwave power is used to initiate and maintain a plasma discharge that can create conditions similar to those found in known microwave plasma diamond CVD reactors. The partial pressure of active gases may be 1 Torr and greater in some configurations. The absorbed RF power can be 10 W-cm$^{-3}$ and greater.

Using a toroidal plasma apparatus for depositing diamond has numerous advantages. One advantage is that toroidal plasma sources are particularly useful for applications using reactive gaseous species where the plasma is difficult to maintain within a narrowly confining plasma processing chamber and where the plasma or its products have significant interactions with the walls. Atomic hydrogen, which is used for depositing a variety of carbon-based materials, such as diamond, diamond-like carbon, and grapheme, is an example of a reactive gas that is difficult to maintain within a narrowly confining plasma processing chamber, due to its high recombination rate on surfaces and its high chemical activity when dissociated.

Toroidal plasma sources are particularly useful for applications where a very high gas temperature in the plasma is desirable. For example, a very high gas temperature in the plasma region is desirable when processing with hydrogen in order to promote the dissociation of atomic hydrogen from molecular hydrogen and to maintain a high degree of dissociation. In particular, gas temperatures in excess of 2,000° C. have been found to be desirable. In many diamond forming processes according to the present teaching, gas temperatures above 3,000° C. result in particularly favorable conditions for both high deposition rates and high quality of deposited diamond material. In general, the higher the gas temperature in the plasma, the more effective the production of atomic species.

One specific feature of toroidal plasma sources used to grow diamond according to the present teaching is that single-crystal diamond material can be grown having dimensions that are very thick compared with other known apparatus and methods. For example, high quality single-crystal diamond material can be grown with dimensions that are greater than about 1.5 centimeter on any side using the apparatus and methods of the present teaching. Other known apparatus and methods need to mosaic together multiple pieces to achieve single-crystal diamond material with these dimensions. However, it should be understood that the apparatus and methods of the present teaching can be used to grow high-quality single-crystal diamond material with any dimensions. It should also be understood that the apparatus and methods of the present teaching can be used to grow polycrystalline diamond material and other materials.

FIG. 1 illustrates a toroidal plasma source 100 for depositing diamond that includes a toroidal-shape plasma vessel 102 comprising an interior region 103 and a process chamber 104. The process chamber can be formed from a combination of insulating and conductive materials. The toroidal plasma source 100 includes at least some insulating material so that RF power can be coupled through the walls of the chamber to the plasma. The interior walls of the process chamber 104 can have curved surfaces. A magnetic core 106 surrounds a portion of the toroidal-shape plasma vessel 102. A power supply 108 has an output that is electrically connected to the primary windings of the magnetic core 106. It may also be desirable in some embodiments to have the magnetic core 108 positioned within the vacuum chamber itself, where it can surround a section of the plasma loop. In various embodiments, inert and process gases are introduced at any number of locations as described below. The RF power supply 108 is used to energize the magnetic core 106, which in turn causes an electric field to be coupled into the toroidal-shape plasma vessel 102 to form a plasma discharge.

In one embodiment, a second magnetic core 106' surrounds a portion of the toroidal-shape plasma vessel 102. It may also be desirable in some embodiments to have the second magnetic 106' core positioned within the toroidal-shape plasma vessel 102, where it can surround a section of the plasma loop. In some embodiments, the RF power supply 108 has a second output that is connected to the primary windings of the second magnetic core 106'. However, in the embodiment shown in FIG. 1, a second RF power supply 108' has an output that is electrically connected to the primary windings of the second magnetic core 106'. The second RF power supply 108' is used to energize the second magnetic core 106', which in turn causes a second electric field to be coupled into the plasma discharge. In various other embodiments, any number of magnetic cores and any number of power supplies can be used depending upon the geometry of the particular source design. Multiple cores and multiple power supplies allow the voltage along the plasma loop and the total power delivered to the plasma to be tailored to the particular source geometry.

In various configurations of the apparatus according to the present teaching, inert and process gases are introduced at one gas inlet port or at multiple gas inlet points in the toroidal-shape plasma vessel 102. Gas inlet ports as defined herein can be any type of gas input port, such as single or multiple apertures, single or multiple slits, or shower head inlet ports. In the embodiment shown in FIG. 1, the toroidal plasma source 100 includes a first 110, a second 110', and a third 110" gas inlet port.

Gases are introduced at multiple gas input ports in the plasma chamber 100 for various reasons, which depend upon the particular process being used. In general, using multiple gas inlet ports provides the capability of physically separating active and noble gas species along different sections of the plasma loop. The terms "active gas" and "reactive gas" as used herein refers to gases that are part of the process chemistry. In contrast, noble gases, such as argon, are primarily used to assist in sustaining the plasma discharge, though they may, in some processes, play a role in the dissociation process of the active gases.

For example, argon gas can be introduced at one location because less power and lower voltage are required to create and sustain a plasma discharge with argon as compared with other gases. Argon gas is also chemically inert, so that the portions of the plasma chamber exposed to the argon discharge will require less complex and costly materials and construction, as compared to portions of the plasma chamber exposed to hydrogen and other active gases.

For example, in one configuration, the workpiece 112 being processed in the process chamber 104 is positioned near an outlet 114 to the vacuum pump as shown in FIG. 1. In various other configurations, the workpiece 112 being processed is displaced away from the outlet 114. Many embodiments using argon gas introduce the argon gas at a point away from the workpiece 112, while the hydrogen gas, inert gasses, and other process gases are introduced closer to the workpiece 112. Such a configuration will result in more power being dissipated proximate to the workpiece 112, where it is needed in order to provide atomic hydrogen to the workpiece 112 surface.

Calculations indicate significant gas separation will occur under a wide range of gas flows and pressures. For example, for inert gas (such as argon gas used in some methods according to the present teaching) flow rates of 200 sccm or greater, hydrogen flow rates of 200 sccm or less, and pressures greater than 10 Torr, significant gas separation will occur along the plasma loop. In various designs, additional pumping channels and gas input ports are included to provide the desired amount of gas separation in the process chamber 104. In some apparatus and methods according to the present teaching, the plasma source 100 is operated such that the partial pressure of process gases is in the pressure range of 1 Torr to several 100 Torr. However, it should be understood that the present teachings described herein are not limited to specific gasses and specific pressure ranges.

Another reason to introduce gas at a plurality of gas input ports is to provide a desired gas flow pattern. Yet another reason to introduce gas at a plurality of gas input ports is to optimize the flow patterns for particular parameters. For example, a plurality of gas input ports with varying sizes and/or spacing patterns can be used to achieve a desired flow pattern or to optimize the flow of gas for a particular process result. The optimized flow can enhance uniformity on both fixed and rotating substrates.

In various embodiments, the workpiece 112 can be partially or totally immersed in or positioned adjacent to the plasma. In some embodiments, the workpiece 112 is introduced into the toroidal plasma region, in close proximity to the hot plasma core, where it receives adequate flux of atomic hydrogen to deposit high quality films. In one specific embodiment, the workpiece 112 is less than 5 cm from the hot core of the plasma. In this embodiment, a typical distance from the hot plasma core to the workpiece surface is in the range of about 0.1 mm to 5 cm.

In various methods according to the present teaching, the frequency of the RF power supply 108 is generally between about 60 Hz and 100 MHz. However, various factors, including practical limits on power supplies, the desirability of minimizing overall system cost, and the weight of the magnetic core, limit the practical frequency range in many embodiments to between about 20 kHz and 14 MHz. This frequency range is also desirable to maximize the transfer of power from the power supply 108 to the plasma, while avoiding capacitive coupling.

One feature of the toroidal plasma source 100 described in connection with FIG. 1 is that a microwave cavity is not required to form the plasma. Microwave cavities have numerous disadvantages, such as their tendency to form arc discharges. Also, in practice, microwave cavities have a much more limited process parameter space and are much more limited in where the workpiece 112 can be positioned compared with other means of forming a plasma discharge. Microwave cavities also provide a limited range of opportunities to tailor the plasma shape to what might be desirable for particular workpiece types.

Another feature of the toroidal plasma source 100 described in connection with FIG. 1 is that active tuning or matching of the power supply 108 to the plasma load is not generally required, which reduces the complexity and cost. However, in some situations tuning or matching is desirable. Yet another feature of the toroidal plasma source 100 is that the electric fields and voltages inside the device are small compared to those found in microwave sources or in more conventional RF plasma sources. The relatively low electric fields and voltages improve reliability and reduce both erosion of interior surfaces exposed to the plasma environment and damage to the surface of the workpiece.

Many aspects of the present teachings are described in connection with apparatus and methods for depositing diamond and diamond-like substances. However, it is understood that the present teachings are not limited to depositing diamond and like materials. Numerous other embodiments of the toroidal plasma apparatus of the present teaching can be used for etching or cleaning workpiece surfaces. Etching or cleaning can be accomplished by exposing the workpiece to charged species created in the plasma discharge and/or by exposing the workpiece to reactive neutral species created in the plasma discharge.

In other embodiments of the toroidal plasma apparatus of the present teaching, it is configured as a reactive gas source. In these embodiments, the plasma source is configured and operated such that predominantly uncharged reactive gas species reach the workpiece surface. In yet other embodiments of the toroidal plasma apparatus of the present teaching, the toroidal plasma source is configured to deposit and/or etch a roll-to-roll web based workpiece.

In many known diamond deposition systems currently in use, the carbon-containing gas is introduced into the process chamber at a location that is a significant distant from the workpiece being processed. In these known systems, the carbon-containing gas is introduced into the process chamber at the same point where the hydrogen gas is introduced. In these configurations, the plasma in the process chamber dissociates or activates both the hydrogen gas and the carbon containing gas, as well as any other gases being used. However, the optimum plasma conditions and optimum location for dissociation differs for the various species.

For example, the hydrogen molecule is tightly bonded and requires high gas temperature to maintain a desired degree of dissociation. Since a high flux of atomic hydrogen at the workpiece surface is a necessary condition for high growth rate of high quality diamond material, it is necessary that the molecular hydrogen pass through the hot plasma region in order to be effectively dissociated. Atomic hydrogen that recombines back into molecular hydrogen, either through collisions with surfaces or collisions in the gas phase, will be recycled back through the process with no negative effects on the chamber or deposition process.

The conditions for effectively dissociating and utilizing the carbon-containing gas, such as methane, are different. Lower plasma gas temperature can be advantageous because the methane molecule will then not be fully dissociated, which can be advantageous for the process. In addition, methane that is partially or fully dissociated when it strikes the chamber surface may cause some carbon material to be deposited on the chamber surfaces. The carbon deposits can result in contamination of the workpiece caused by flaking material.

One aspect of the present teaching is the realization that introducing carbon-containing gas, such as methane, in the vicinity of the workpiece where deposition occurs provides a number of advantages. With this configuration, the methane will be dissociated in the region between the workpiece surface and the hot plasma core, where the plasma gas temperature is optimum for that purpose. Under these conditions, the carbon atoms and carbon-containing species have a higher probability of striking the workpiece surface first, where they will add to the deposition process, rather than striking the chamber surfaces where they will leave undesirable deposits that can result in contamination. More generally, the methods of the present teaching introduce process gasses at various positions within the system in order to improve or optimize the deposition conditions and to reduce or minimize undesirable deposits on the walls of the reactor. The advantages of these methods have been demonstrated through multiple deposition experiments where deposition rates were measured (via film thickness measurements and mass gain measurements), film quality was measured (via Raman spectroscopy, optical microscopy, and electron microscopy), and chamber cleanliness was measured after deposition (via optical inspection).

The optimum distance from the workpiece at which the carbon containing gas is introduced depends on the size of the workpiece and the process conditions. As an example, for operating pressures of 10-200 Torr and workpiece sizes of 0.3 cm to 1 cm, the optimum distance at which the carbon containing gas should be introduced from the edge of the workpiece is in the range of 0.1 cm to 5 cm.

In some configurations of the apparatus according to the present teaching, the vacuum pumping flow pattern influences the manner in which dissociated species of both carbon and hydrogen reach the workpiece surface. Vacuum pumping patterns designed such that the dissociated carbon species sweep over the workpiece surface can be used to enhance the effect of introducing the gas near the workpiece surface.

Note that it may be desirable in some methods according to the present teaching to introduce in the vicinity of the workpiece gases other than carbon containing gases. For example, in various embodiments, all or some of the hydrogen gas flow may be introduced in the vicinity of the workpiece along with methane. Also, some of the methane may be introduced at one or more points into the chamber in addition to being introduced in the vicinity of the workpiece surfaces. Also, some amount or argon or other inert gas may be introduced in the vicinity of the workpiece surfaces to achieve various process goals. In some embodiments all of the methane may be introduced away from the vicinity of the workpiece surfaces in order to achieve particular process goals or to allow for simplification of the apparatus.

Another aspect of the present teaching is particular toroidal plasma system designs and configurations that allow more of the reactive gas to be effectively used in depositing diamond material. More specifically, some embodiments of the toroidal plasma system according to the present teaching include a workpiece holder design for a toroidal plasma deposition system with a shape and a material composition that serves to both confine and to direct the plasma. These workpiece holder designs provide one or more or the following features as compared to prior art workpiece holders: (1) higher deposition rates; (2) higher quality of the material deposited; (3) improved uniformity of deposition across an individual workpiece; (4) improved uniformity of deposition among multiple workpieces; (5) higher utilization of input gases; and (6) cleaner process chamber.

Figure 2A:
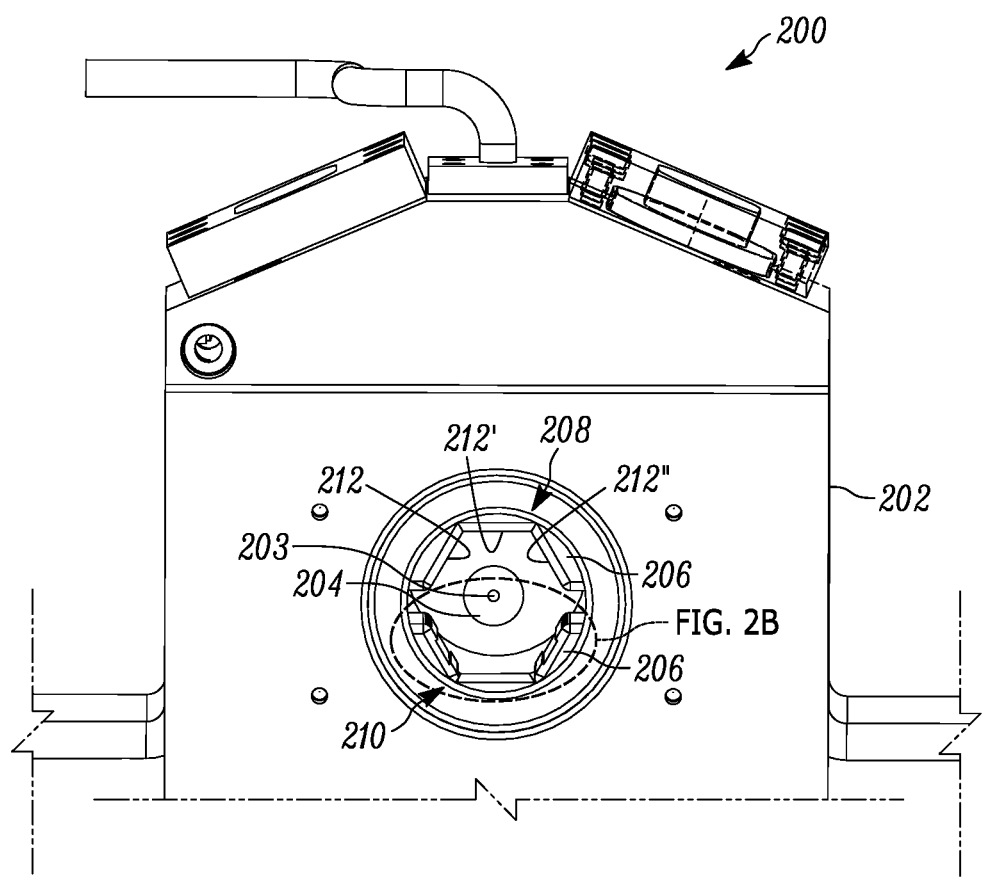
FIG. 2A illustrates an embodiment of a cross-section view of a toroidal plasma deposition system of the present teaching comprising a process chamber that is part of a toroidal-shaped structure.
Figure 2B:
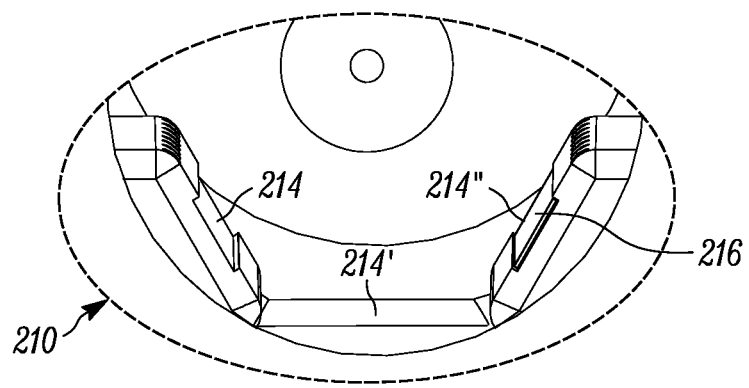
FIG. 2B illustrates a close-up view of a section of the toroidal plasma deposition system shown in FIG. 2A.

FIG. 2A illustrates an embodiment of a cross-section view of a toroidal plasma deposition system 200 of the present teaching comprising a process chamber 202 that is part of a toroidal-shaped structure. FIG. 2B illustrates a close-up view of a section of the toroidal plasma deposition system shown in FIG. 2A. A loop of plasma 204 enters the process chamber 202 as shown, flowing into or out of the page. The workpiece holder 206 is positioned inside the process chamber 202.

In some embodiments according to the present teaching, the workpiece holder 206 has features that secure the workpiece. In other embodiments, the workpiece holder 206 holds the workpiece by friction or gravity or is designed to have a thermal bonding agent attach the workpiece to the workpiece holder. In yet other embodiments, a reduced gas pressure is provided at the back surface of the workpiece relative to the front surface to provide adequate force to hold the workpiece in place. In addition, in some embodiments, the workpiece holder is designed to be the workpiece itself where diamond or some other material will be deposited. These features will allow for many advantages related to quality of material deposited, process control, throughput, process rates, and cleanliness of the overall process chamber during the deposition process.

One aspect of the toroidal plasma deposition system of the present teaching is that in some embodiments it includes a plasma guiding structure that is shaped and dimensioned so as to constrain a section of plasma in the toroidal plasma loop to travel substantially perpendicular to a normal to at least one face. In some specific embodiments, the plasma guiding structure is the workpiece holder itself. However, in many other embodiments, the plasma guiding structure is physically separate from the workpiece. In some embodiments, the workpiece holder can be positioned on the plasma guiding structure, but can also be translated independently of the plasma guiding structure during operation.

Although many aspects of the plasma guiding structure are described herein in connection to the workpiece holder 206, one skilled in the art will appreciate that the present teachings are not limited to specific embodiments where the workpiece itself is the plasma guiding structure.

One aspect of the present teaching is that the workpiece holder itself can guide a section of the plasma traveling in the toroidal plasma loop. For example, the shape of the workpiece holder guides the section of the plasma passing through the workpiece holder such that the section of the plasma propagates in substantially a straight line that is perpendicular to the normal to the face of the workpiece holder. In one embodiment, the shape of the workpiece holder 206 that guides the plasma is such that all surfaces facing the plasma are approximately equidistant from a centerline 203 of the plasma so that the plasma will stay centered.

It has been determined that a cylindrical workpiece holder can provide sufficient plasma guiding for many applications provided that the distance from the centerline 203 of the plasma to any surface does not vary significantly. In practice, such a geometry is difficult to achieve because it is difficult to mount samples on a curved surface. As such, FIGS. 2A and 2B illustrate a hexagon-shaped workpiece holder 206 that provides good performance. The faces of the hexagon present flat or nearly flat surfaces to the plasma. These flat or nearly flat surfaces allowing easy sample mounting and provide good performance. One skilled in the art will appreciate that numerous other geometries can be used.

One aspect of the plasma processing apparatus of the present teaching is that the line of plasma is surrounded in part or completely by the workpiece holder that is shaped to guide the plasma. Thus, the workpiece holder itself guides the plasma. In this configuration, a larger fraction of the plasma can be utilized as compared with conventional microwave reactors, thus providing improved efficiency. One important parameter of the plasma processing apparatus is the distance between the edge of the workpiece holder and the plasma. If the plasma is too close to the surface of the workpiece holder, the plasma may either fail to ignite or, even if it does ignite, it may become unstable or lose substantial heat energy to those surfaces of the workpiece holder. If the surfaces of the workpiece holder are too far away from the plasma, the plasma does not interact and, therefore, is not guided by those surfaces resulting in the plasma wandering. For example, in some particular embodiments which are known to have good performance, the distance of a normal drawn from the center line 203 of the plasma 204 to each of the faces of the workpiece holder 206 is between 0.5 cm and 2.5 cm and, in one particular embodiment, is approximately 1.0 cm.

In general, the shape of the plasma 204 depends in part on the plasma operating pressure. At relatively low operating pressures, the plasma 204 is relatively large, which requires a more distant guiding structure. At relatively high operating pressure, the plasma 204 is relatively narrow, which requires a less distant guiding structure.

The workpiece holder 206 can be a single structure or can be segmented in two or more sections. For example, in the embodiment illustrated in FIGS. 2A and 2B, the workpiece holder 206 is segmented into a first and a second section 208, 210. The first and second sections 208, 210 can be equal half sections. In various embodiments, either or both sections 208, 210 of the workpiece holder 206 may themselves also serve as the workpiece, with the deposition material, such as diamond material, being directly deposited onto the workpiece holder. For example, it is well known in the art that polycrystalline diamond can be directly deposited on molybdenum. Therefore, a molybdenum holder may serve a dual purpose, both to guide and contain the plasma and also to act as a substrate for the deposition of polycrystalline diamond material. In various embodiments, either or both sections 208, 210 of the workpiece holder 206 may or may not hold workpieces.

In the embodiment shown in FIGS. 2A and 2B, the workpiece holder 206 includes two sections 208, 210 that are roughly equal half sections. Each of the two sections 208, 210 of the workpiece holder 206 can be formed of the same or different materials. In various other embodiments, the workpiece holder 206 is constructed utilizing more than two different pieces of material. For example, in one embodiment that is described further in the example below, one workpiece holder section 208 is formed from copper, and the other workpiece holder section 210 is formed from molybdenum.

The particular material used to form the workpiece holder is important for some applications. For example, in some applications, the thermal loads are very high. Consequently, either the material forming the workpiece holder must have high thermal conductivity, or it has to be able to accommodate high temperatures for required processing times, or both. Examples of the materials with relatively high thermal conductivity suitable for these applications are copper, nickel, aluminum, and aluminum nitride. Examples of materials that can tolerate high processing temperatures for the required processing times are various refractory metals, such as molybdenum and tungsten and their alloys; specialty high-temperature metallic alloys (superalloys); and for some processes, aluminum oxide or aluminum nitride. For high temperature applications, the material also needs to be able to withstand significant temperature-induced stresses. In some embodiments, thermal loads on the workpiece holder are managed by positioning a cooling element adjacent to or in thermal communication with the back, sides, or interior of the workpiece holder as described in connection with FIG. 7.

In addition, the material forming the workpiece holder must be able to withstand the desired process chemistry. For diamond deposition, the material forming the workpiece holder must be able to withstand high temperatures, which are typically 700° C.-1200° C., and hydrogen chemistry, which attacks many materials, particularly at these high temperatures. For example, aluminum oxide, which is a common material used to support workpieces for plasma processing, may not be suitable when operated at high temperatures and exposure to atomic hydrogen. Under these conditions, the atomic hydrogen will tend to strip the oxygen from the surface. Molybdenum, tungsten, various alloys of molybdenum and tungsten, copper, and aluminum nitride are more suitable under these conditions because of their thermal and chemical resistance properties. Other materials, such as silicon, are also suitable. Silicon is used when the workpiece holder is also the workpiece itself. For some methods according to the present teaching, stainless steel, nickel, and alloys of various metals may be used. While these materials are all suitable for high temperature operation, it is also possible to utilize them in lower temperature operation as well.

For applications where it is desirable for the workpiece holder 206 to operate at lower temperatures that are well under the temperature used for depositing the diamond material, other materials such as copper, aluminum, and nickel as well as alloys of these materials may be used. Metallic materials, such as copper and aluminum, have the advantage that they have high thermal conductivity, so heat from the plasma can be readily extracted. In addition, these materials can be readily machined or formed into a variety of shapes at a lower cost than either ceramics or refractory metals. In any of these exemplary materials, it may be desirable for the workpiece holder to be coated with an insulating material that provides chemical compatibility or that inhibits plasma arcing to the workpiece holder.

In the following example, the workpiece holder section 208 is formed from copper, and the other workpiece holder section 210 is formed from molybdenum. The shape and dimensions of the copper workpiece holder section 208 assembly surrounding the line of plasma 204 are chosen to both constrain the plasma 204 so that it travels in a desired path through the chamber 202, into the page of FIG. 2A, and also to allow for efficient deposition of diamond material on the workpiece. In some embodiments, the shape and dimensions of the copper workpiece holder section 208 assembly surrounding the line of plasma 204 are chosen to constrain the plasma 204 so that it travels in a substantially straight line through the chamber 202. One skilled in the art will appreciate that the present teachings are not limited to constraining the plasma with the workpiece holder. In other embodiments, other structures that may work with or independently of the workpiece holder are used to constrain the plasma.

In the embodiment illustrated in FIGS. 2A, 2B, there are three flat faces 212, 212', 212" forming the copper workpiece holder section 208. In addition, there are three flat faces 214, 214', 214" forming the molybdenum workpiece holder section 210. In other embodiments, depending on the process conditions and the workpiece on which the deposition is occurring, as few as one, or more than three, flat faces can be employed on a given workpiece holder section. These multiple flat faces can themselves be part of a single workplace holder element or they may each be a separate physical element, which together forms the workplace holder.

In other embodiments, the faces of the workpiece holder 206 are rounded surfaces. In still other embodiments, the faces of the workpiece holder 206 have a tubular-shaped faces. The outside portion of the copper workpiece holder section 208 assembly may include viewports through which an optical pyrometer can measure the temperature of the workpieces and the workpiece holder.

The molybdenum workpiece holder section 210 of the workpiece holder 206 illustrated in FIGS. 2A and 2B also has a shape that is chosen to constrain the plasma 204 to travel in a straight line while allowing efficient deposition of diamond on the surface of the workpiece 216. In some embodiments, the workpieces 216 are mounted into recesses machined into the workpiece holder 206. In other embodiments, workpieces are mounted directly on the surface of the workpiece holder 206. The workpieces 216 may be kept in place by securing them with a mechanical device, such as a clip, by the force of gravity, or by securing them with a high-temperature bonding material.

In some embodiments, a thermal insulating material is positioned between the workpiece 216 and the workpiece holder 206. This configuration allows the workpiece 216 to run hotter than the workpiece holder 206 during the deposition process. In some embodiments, a high temperature bonding material is positioned between the workpiece 216 and the workpiece holder 206 to improve thermal transfer of the heat energy created by the plasma process. The high temperature bonding material allows a higher flux of atomic hydrogen to interact with the workpiece 216 surface while maintaining the workpiece 216 surface at a desired or optimum temperature. The high temperature bonding material also results in a reduction in the temperature gradient across the workpiece 216 surface, thereby providing better deposition uniformity.

Figure 3A:
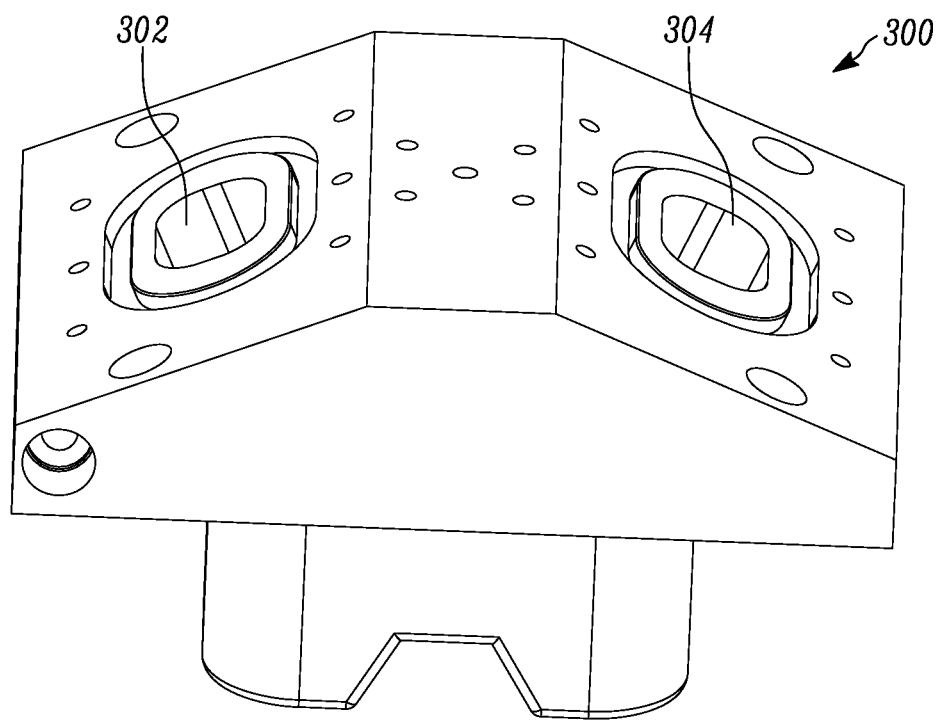
FIG. 3A illustrates an embodiment of a workpiece holder section according to the present teaching that is made of copper.

One aspect of the present teaching is that the workpiece holder geometry includes features that allow for access for measurement instrumentation. FIG. 3A illustrates an embodiment of a workpiece holder section 300 according to the present teaching that is made of copper. The workpiece holder section 300 includes viewports 302, 304. The viewports 302, 304 allow an optical pyrometer measurement system to receive radiation from the process chamber to provide temperature readings of the workpieces and the workpiece holder. In various embodiments, the viewports 302, 304 have various sizes and positions. However, it should be understood that, in some embodiments, there are one or no viewports on the workpiece holder. The viewports 302, 304 may be used for other diagnostic purposes, such as measuring the deposition rate, sample thickness, sample quality and plasma optical characteristics.

Figure 3B:
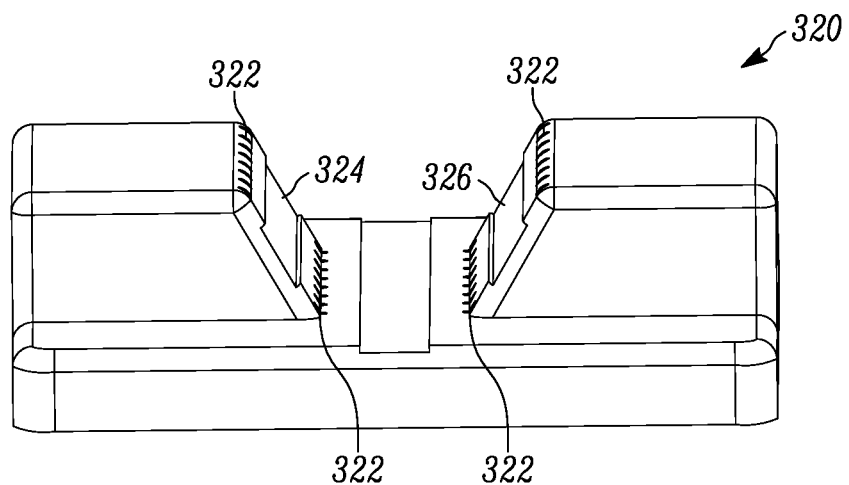
FIG. 3B illustrates a top-perspective-view of an embodiment of a workpiece holder section fabricated from a refractory metal according to the present teaching.

One feature of the present teaching is that the workpiece holder geometry can be chosen to include various features that support channeling for various fluids, including process gases, and cooling fluids. FIG. 3B illustrates a top-perspective-view of an embodiment of a workpiece holder section 320 formed of a refractory metal according to the present teaching. For example, the workpiece holder section 320 can be formed of molybdenum. The workpiece holder section 320 includes gas introduction apertures 322 located proximate to the recess areas 324, 326 where workpieces are mounted. The recess areas 324, 326 can be designed specifically for supporting workpieces that have particular dimensions. Furthermore, the height of the recess areas 324, 326 can be chosen to shield the edges of the workpiece from unwanted deposition and/or to provide a more uniform environment for the deposition.

The workpiece holder section 320 can be cooled directly by circulating fluids or gases inside of the workpiece holder section 320. The workpiece holder section 320 can also be cooled by positioning a heat sink or other temperature controlling structure in intimate or close physical contact with the workpiece holder section 320 so that it is in thermal communication with the workpiece holder section 320. An adjustable stage can be used to control the position of a cooling element relative to workpiece in order to precisely control the temperature of the workpiece as described in connection with FIG. 7.

In some embodiments, the workpiece holder includes a crystal puller mechanism that pulls the workpiece during the deposition. Such a crystal puller mechanism is particular useful for growing diamond. In one method of operation, the crystal puller mechanism is used to keep the growing surface at substantially the same or at a particular position at all times during the growth.

Figure 3C:
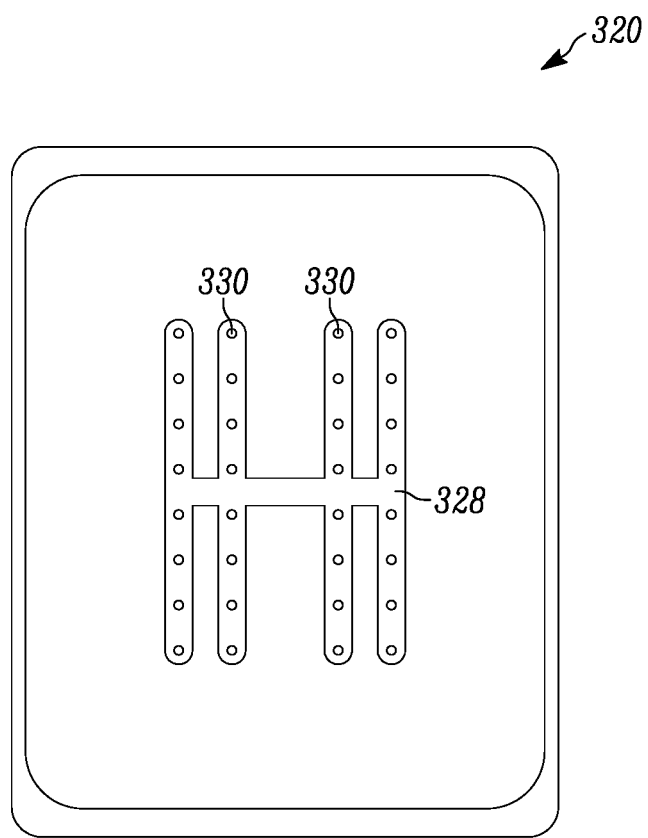
FIG. 3C illustrates a bottom-view of the workpiece holder section of FIG. 3B

FIG. 3C illustrates a bottom-view of the workpiece holder section 320 shown in FIG. 3B. FIG. 3C shows the backside of the workpiece holder section 320. Gas is introduced into a gas plenum 328 on the backside of the workpiece holder section 320. The gas spreads throughout the gas plenum 328 and through apertures 330 that lead to the front side of the workpiece holder section 320. Thus, the gas plenum 328 allows the gas to be distributed evenly through the multiple apertures 330 that go through to the front surface of the holder section 320 where the workpieces are mounted.

The workpiece holder section 320 shown in FIG. 3C can be mounted on a fluid cooled temperature controller, such as a water-cooled copper holder, that provides cooling to the molybdenum or other material forming the workpiece holder section 320. The degree of cooling can be changed in a number of different ways. For example, the degree of cooling can be changed by using high temperature spacing shims between the molybdenum piece and the copper. Also, the degree of cooling can be changed by altering the back-side contact area on the molybdenum. Also, the degree of cooling can be changed by altering the front-side contact area on the copper. In addition, the degree of cooling can be changed by changing the emissivity of the back-side of the molybdenum through either texturing the molybdenum or through adding a coating to the molybdenum. The degree of cooling can also be tuned locally within the workpiece holder section 320 by adding or removing material in proximity to individual workpieces within the workpiece holder. In some embodiments, the added materials have different thermal conductivities and/or different coefficients of thermal expansion. The degree of cooling can also be controlled by varying the gas pressure between the back-side of the molybdenum and the front side of the copper.

Figure 4:
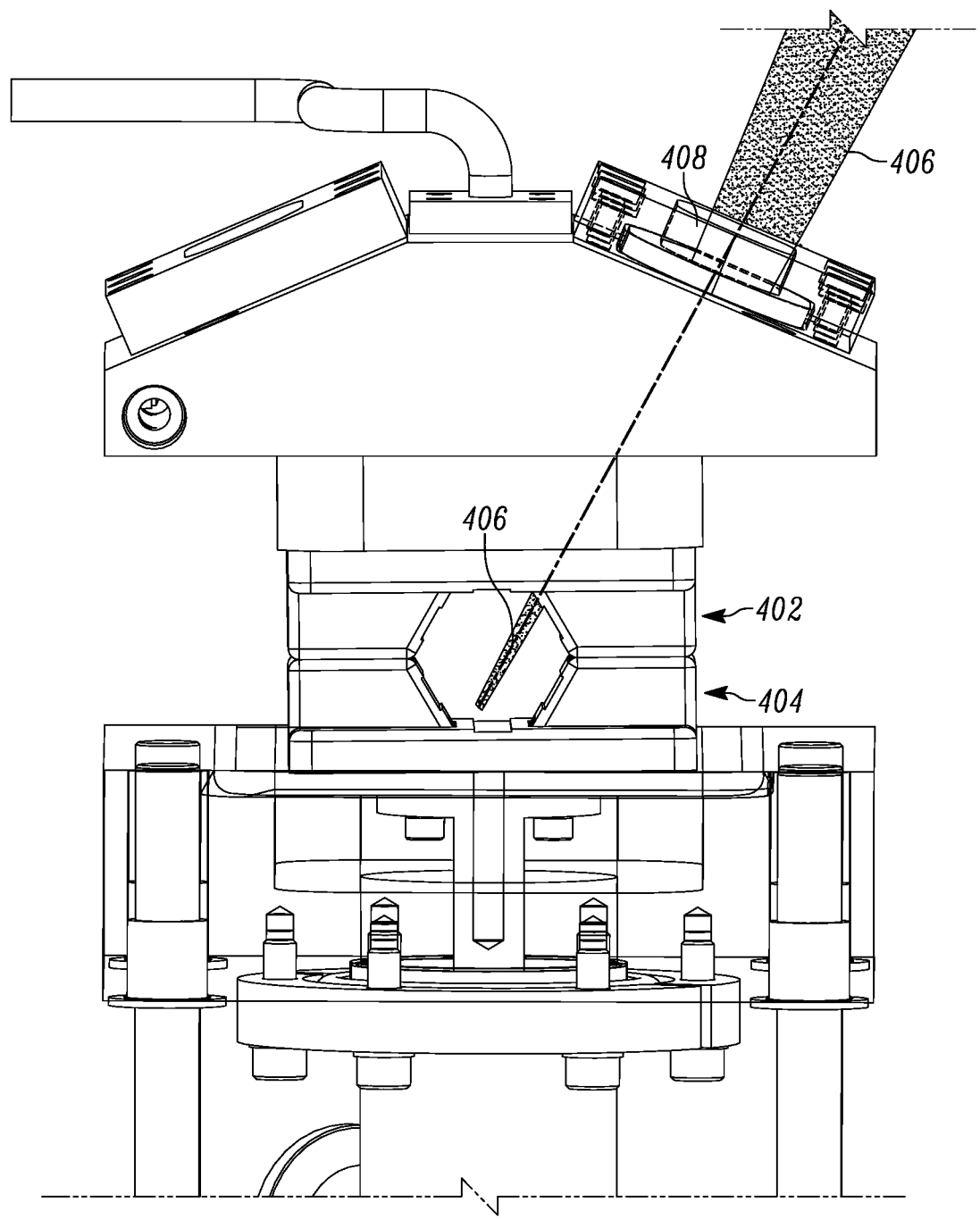
FIG. 4 illustrates a cross-sectional view of an embodiment of a toroidal plasma deposition system comprising a refractory metal workpiece holder of the present teaching.

FIG. 4 illustrates a cross sectional-view of a toroidal plasma deposition system 400 in a configuration with two workpiece holder halves 402, 404 both formed of a refractory metal, such as molybdenum. In order to illustrate features of the present teaching, the process chamber itself is cut away and not shown in FIG. 4. The workpiece holder section 402 on the top includes viewports through which electromagnetic radiation 406 emanating from a workpiece (not shown) and the workpiece holder section 404 can pass. In this embodiment, the viewports are part of the structure of the workpiece holder section 402. There are no viewports on the bottom workpiece holder section 404 in this particular configuration. The radiation 406 passes through a port 408 on the top of toroidal plasma deposition system 400 and then passes in the field-of-view of a pyrometer (not shown) that is used to monitor the workpiece and/or workpiece holder temperature. It may also be desirable in some configurations to use a fiber-based temperature measurement, with the end of the fiber positioned close to the backside of the sample being measured.

In some embodiments, the portion of the workpiece holder supporting the workpiece is attached to a manual stage. In other embodiments, the portion of the workpiece holder supporting the workpiece is attached to an automated stage. In these embodiments, the automated stage can be used in an open or closed loop feedback mode during processing to achieve certain process goals. Similarly, the workpiece itself can be attached to a manual stage or to an automated stage. In many embodiments, pulling the workpiece holder or the workpiece itself away during growth does not appreciably change the geometry of the guiding structure presented to the plasma.

In one method according to the present teaching, the automated stage is configured to retract the portion of the workpiece holder supporting the workpiece or the workpiece itself at approximately its growth rate. Also, in one method according to the present teaching, the automated stage is configured to move the portion of the workpiece holder supporting the workpiece or the workpiece itself in such a way as to control a temperature of the workpiece during processing.

Figure 5A:
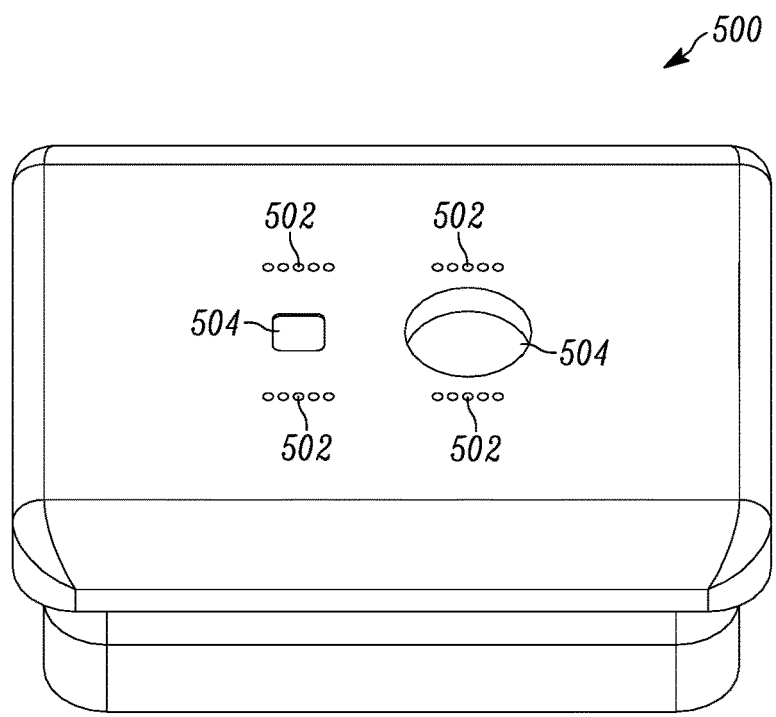
FIG. 5A illustrates the front-side of an embodiment of a workpiece holder of the present teaching.

One feature of the present teaching is that the process gas can be introduced in close proximity to the workpieces. FIG. 5A illustrates the front-side of an embodiment of a workpiece holder 500 of the present teaching. The workpiece holder 500 includes apertures 502 proximate to recesses 504 that are used to secure the workpieces. The apertures 502 direct process gas in the close proximity to the workpiece during processing.

Figure 5B:
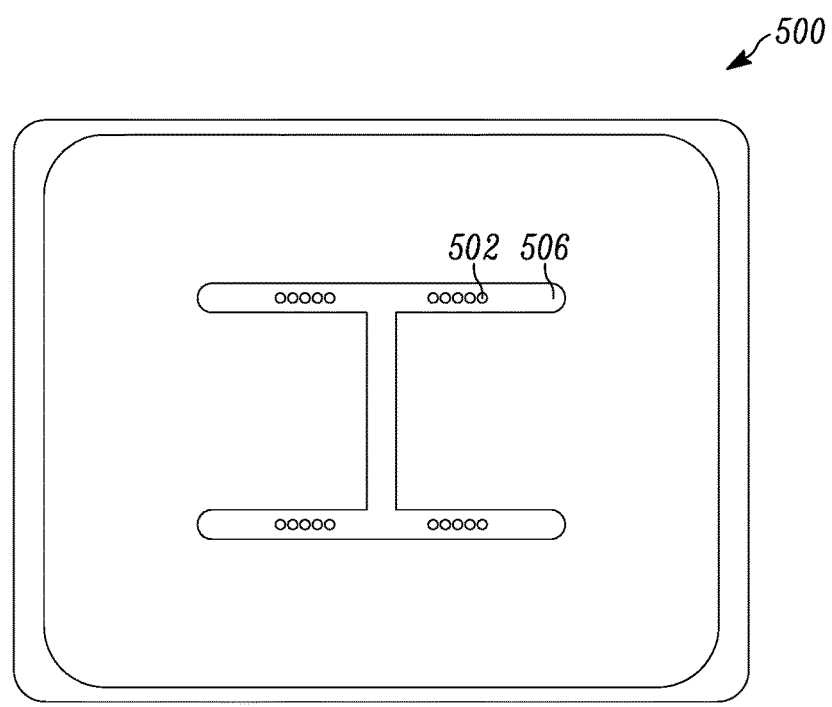
FIG. 5B illustrates the backside of an embodiment of a workpiece holder of the present teaching.

FIG. 5B illustrates the back-side of an embodiment of a workpiece holder 500 of the present teaching. A gas plenum 506 distributes the process gas among the apertures 502 which pass through to the front-side of the workpiece holder 500. For some specific applications, it may be desirable to use a flat workpiece holder with front-side gas distribution in combination with an opposing element which may itself also be flat. In other applications, it may be desirable to use the flat workpiece holder with front-side gas distribution in combination with an opposing element that may be constructed so as to assist in maintaining the plasma directionality.

Figure 6:
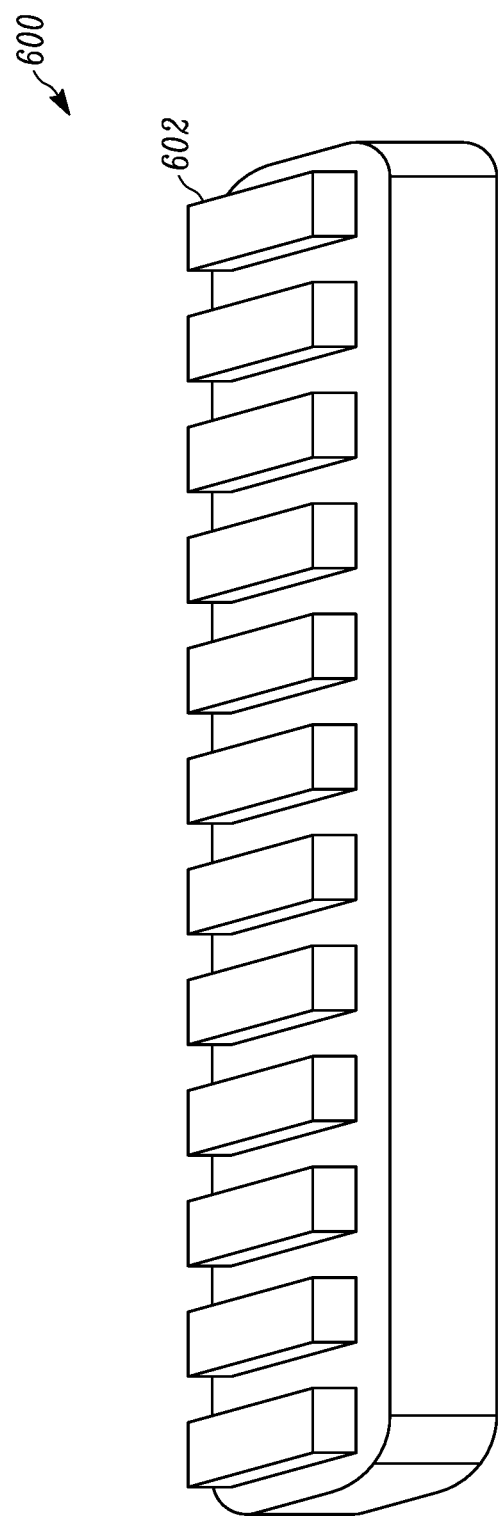
FIG. 6 illustrates an embodiment of a workpiece holder 600 according to the present teaching that includes individual pillars for holding workpieces.

FIG. 6 illustrates an embodiment of a workpiece holder 600 according to the present teaching that includes individual pillars for holding workpieces. This workpiece holder can be mounted to a face of the workpiece holder section 210 that is described in connection with FIGS. 2A and 2B. In some embodiments, the workpiece holder 600 includes pillars 602 for securing individual workpieces. The pillars 602 are not limited to rectangular and cylindrical-shaped pillars. The pillars 602 can have various sizes and shapes. Some or all of the pillars 602 can have process gas fed to them. Providing process gas to the pillars 602 will allow a highly consistent environment for each sample, while keeping deposition gases away from other parts of the process chamber. In some embodiments, the pillars 602 include a recess for additionally supporting the workpieces. The dimensions of the workplace holder 600 depend on the dimensions of the process chamber. In one example, the length of the process chamber along the axis of the plasma is about 15 cm long and the length of the workpiece holder is about 10 cm.

Figure 7:
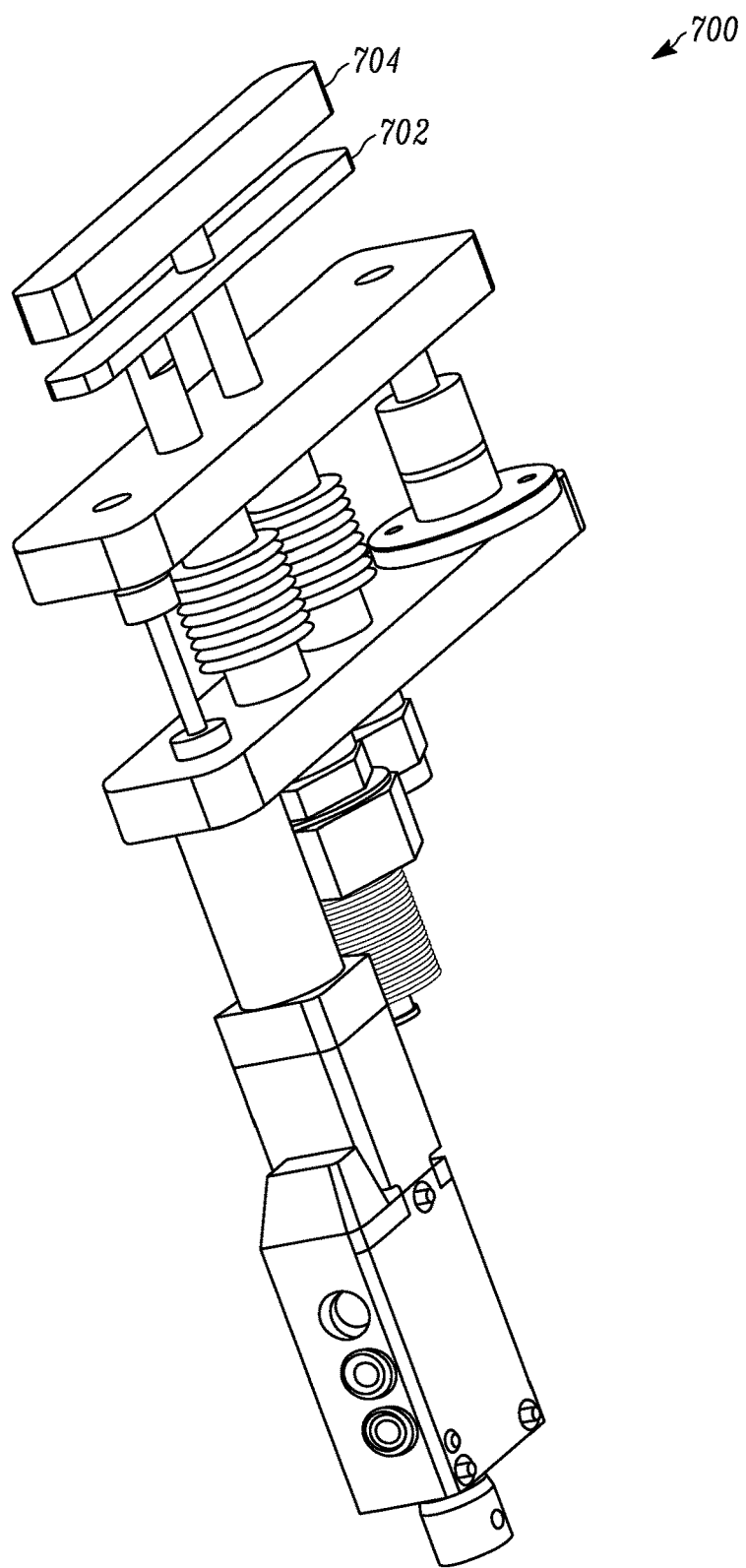
FIG. 7 illustrates a translation stage that is used to control the relative positions of a cooling element, a workpiece holder, and a plasma guiding element according to the present teaching to achieve various process goals.

FIG. 7 illustrates a translation stage 700 that is used to control the relative positions of a cooling element 702, a workpiece holder 704, and a plasma guiding element according to the present teaching to achieve various process goals. In some methods of operation, the translation stage 700 is used to control the position of a cooling element 702 relative to the workpiece holder 704 in order to precisely control the temperature of the workpiece. The translation stage 700 is configured so that the cooling element 702 and the workpiece holder 704 can be moved together or independently to achieve various process goals. In various methods according the present teaching, the position of the cooling element 702 relative to the workpiece holder 704 is adjusted to control the temperature of the workpiece holder 704 to a desired operating temperature. Temperature control is accomplished by a combination of radiative heat transfer and convective heat transfer, which occurs from gases in the chamber moving between the hot workpiece holder 704 and the cooling element. In some embodiments, the position of the cooling element 702 is adjusted manually. In other embodiments, the position of the cooling element 702 is adjusted via an automated stage that is controlled in feedback loop which controls one or both of the temperature of the sample and the temperature of the sample holder to desired temperatures.

In one embodiment of the present teaching, the translation stage 700 performs the function of a crystal puller in that it is configured to move the workpiece holder 704 during growth in order to assist in the growth process. In some methods according to the present teaching, the workpiece holder 704 is translated at approximately a growth rate of the single-crystal diamond. Also, in some methods according to the present teaching, the workpiece holder 704 is translated so that a growing surface on the workpiece is at substantially the same position during at least a portion of the growth. In these methods, the cooling element 702 can translate along with the workpiece holder 704, can be stationary with respect to the workpiece holder 704, or can move at a different rate relative to the workpiece holder 704 in order to achieve various process goals.

Moving the workpiece with the translation stage 700 during growth facilitates the growth of relatively large high-quality single-crystal diamond structures that can be greater than 1.5 centimeters in any dimension. Thus, one feature of the present teaching is that the combination of the translation stage 700 and the toroidal plasma processing apparatus configuration described herein provides significant flexibility in the growth process that is not possible with other known apparatus, such as microwave plasma apparatus.

Figure 8:
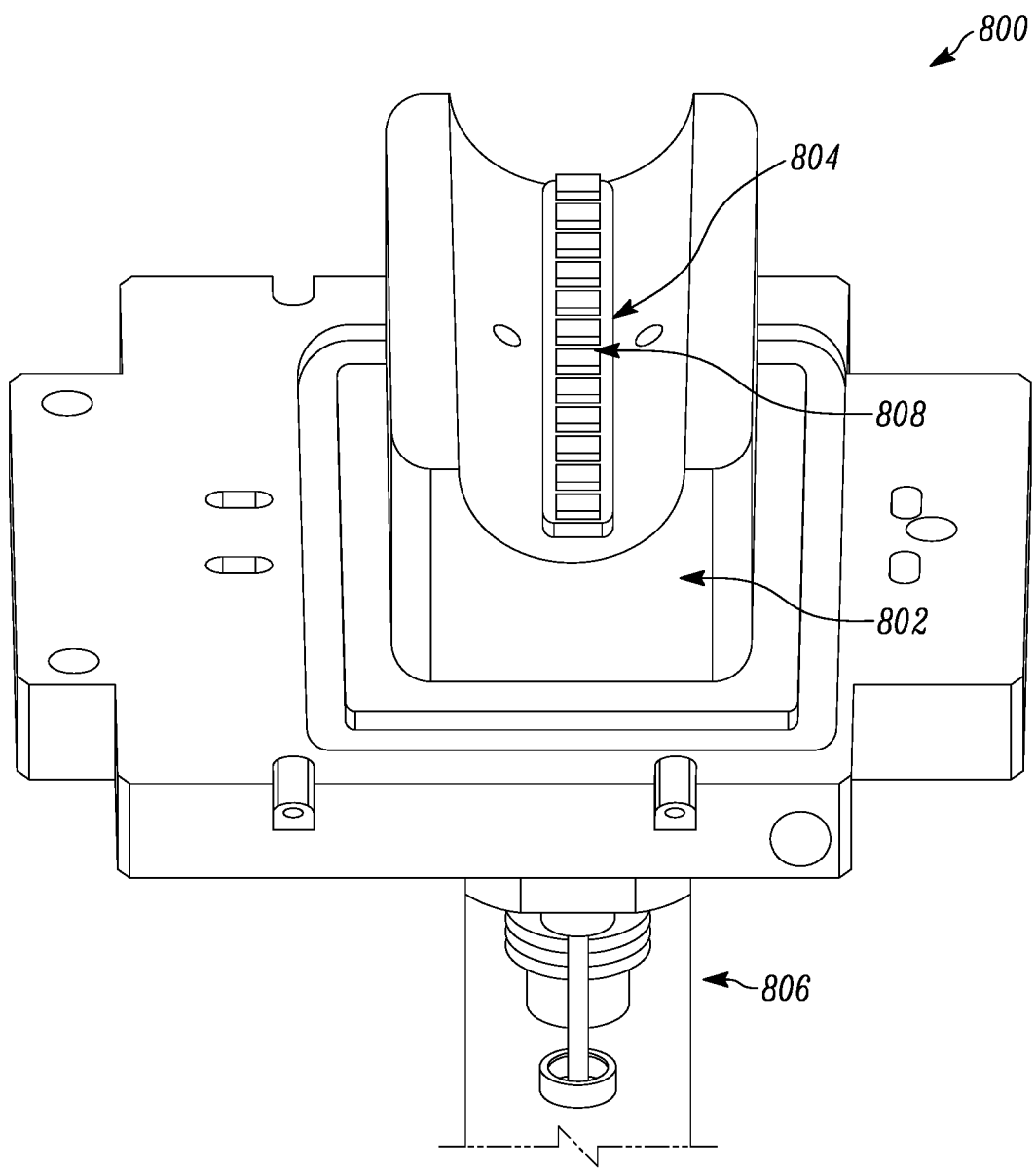
FIG. 8 illustrates an embodiment of plasma processing apparatus 800 of the present teaching with a separate plasma guiding structure and workpiece holder that is coupled to the translation stage described in connection with FIG. 7.

FIG. 8 illustrates an embodiment of a workpiece holder assembly 800 for a plasma processing apparatus of the present teaching with a separate plasma guiding structure 802 and workpiece holder 804 that is coupled to the translation stage 806 described in connection with FIG. 7. The workpiece holder 804 supports a workpiece 808 for growth. In the configuration of the workpiece holder assembly 800, shown in FIG. 8, the workpiece holder 804 fits inside a slot in the plasma guiding structure 802 so that it can be freely position by the translation stage 806.

The plasma guiding structure 802 is shaped to guide the plasma in a desired path. The plasma guiding structure 802 can be formed as continuous piece or can be formed as a plurality of segmented pieces. In various embodiments, the plasma guiding structure 802 is formed in the shape of a plurality of half-circles segments, a plurality of circular segments, or one or a plurality of short cylindrical sections. These structures are dimensioned to be long enough and spaced close enough together so that the plasma is confined enough to keep it from moving significantly from the desired path in the toroidal-shape plasma vessel.

The translation stage 806 can be configured in various ways. For example, the translation stage can be configured to move the workpiece holder 804 relative to a fixed plasma guiding structure 802. The translation stage 806 can also be configured to move both the workpiece holder 804 and the plasma guiding structure 802 independently. In addition, the translation stage 806 can be configured to move any of the plasma guiding structure 802, the workpiece holder 804, and the cooling element 702 (FIG. 7) together or independently.

Thus, in various embodiments, a plasma guiding structure and workpiece holder according to the present teaching have several desirable features. The plasma guiding structure is shaped such that it improves or optimizes one or both of the plasma shape and the delivery of atomic hydrogen to the surface of the workpieces mounted on the workpiece holder. The workpiece holder introduces carbon-containing gas in close proximity to the workpiece surface. These features can be provided separately or together in various embodiments, depending on the application. Furthermore, in some embodiments of the toroidal plasma deposition system of the present teaching, the workpiece holder is constructed so as to additionally function as the vacuum wall.

EQUIVALENTS

While the Applicant's teaching is described in conjunction with various embodiments, it is not intended that the Applicant's teaching be limited to such embodiments. On the contrary, the Applicant's teaching encompasses various alternatives, modifications, and equivalents, as will be appreciated by those of skill in the art, which may be made therein without departing from the spirit and scope of the teaching.

What is claimed is:

1. A plasma processing apparatus comprising:
   a) a toroidal-shape plasma vessel comprising a process chamber;
   b) a magnetic core surrounding a portion of the toroidal-shape plasma vessel;
   c) an RF power supply having an output that is electrically connected to the magnetic core, the RF power supply energizing the magnetic core, thereby forming a toroidal plasma loop discharge in the toroidal-shape plasma vessel;
   d) a workpiece holder comprising at least one face that supports the workpiece during growth; and
   e) a plasma guiding structure being shaped and dimensioned so as to constrain a section of a plasma in the toroidal plasma loop discharge to travel substantially perpendicular to a normal to the at least one face that supports a workpiece during growth.

2. The plasma processing apparatus of claim 1 wherein the workpiece holder is formed in a generally cylindrical shape.

3. The plasma processing apparatus of claim 1 wherein the workpiece holder is formed in a generally hexagonal shape.

4. The plasma processing apparatus of claim 1 wherein the plasma guiding structure is formed in a shape and dimensioned so that workpiece surfaces exposed to the plasma are approximately equidistant from a centerline of the plasma.

5. The plasma processing apparatus of claim 1 wherein a distance from a center line of the plasma to the at least one face that supports the workpiece is approximately between 0.5 cm and 2.5 cm.

6. The plasma processing apparatus of claim 1 wherein a distance from a center line of the plasma to the at least one face that supports the workpiece is approximately 1.0 cm.

7. The plasma processing apparatus of claim 1 wherein the workpiece holder is formed of a material selected from the group consisting of molybdenum, alloys of molybdenum, copper, aluminum, nickel, stainless steel, alloys containing nickel, tungsten, alloys containing tungsten, aluminum nitride, and aluminum oxide.

8. The plasma processing apparatus of claim 1 wherein the workpiece holder comprises a recessed portion for supporting a workpiece for plasma processing.

9. The plasma processing apparatus of claim 1 wherein the at least one face that supports the workpiece during growth comprise at least one flat face.

10. The plasma processing apparatus of claim 1 wherein the at least on face that supports the workpiece during growth comprise at least one rounded face.

11. The plasma processing apparatus of claim 1 wherein the at least one face that supports the workpiece during growth comprise at least one tubular-shaped face.

12. The plasma processing apparatus of claim 1 wherein an outside portion of the workpiece holder comprises a viewport.

13. The plasma processing apparatus of claim 12 further comprising an optical pyrometer that is optically coupled to the viewport.

14. The plasma processing apparatus of claim 1 further comprising an electrical insulating material positioned on the workpiece holder that inhibits plasma arcing to the workpiece holder.

15. The plasma processing apparatus of claim 1 wherein the workpiece holder further comprises at least one gas introduction aperture.

16. The plasma processing apparatus of claim 15 wherein the at least one gas introduction aperture is positioned proximate to at least one sample mounting position on the surface of the workpiece holder.

17. The plasma processing apparatus of claim 1 further comprising a fluid cooled temperature controller attached to the workpiece holder.

18. The plasma processing apparatus of claim 1 further comprising a second magnetic core surrounding the toroidal-shape plasma vessel.

19. The plasma processing apparatus of claim 18 wherein the RF power supply has a second output that is electrically connected to the second magnetic core.

20. The plasma processing apparatus of claim 18 further comprising a second RF power supply having an output that is electrically connected to the second magnetic core, the second RF power supply energizing the second magnetic core.

21. The plasma processing apparatus of claim 1 wherein the workpiece holder comprises at least one pillar for securing individual workpieces.

22. The plasma processing apparatus of claim 21 wherein process gases are supplied proximate to the at least one pillar.

23. The plasma processing apparatus of claim 1 wherein the workpiece holder further comprises a crystal puller that translates the workpiece during the growth.

24. The plasma processing apparatus of claim 1 wherein the workpiece holder and the plasma guiding structure are the same structure.

25. The plasma processing apparatus of claim 1 wherein the workpiece holder and the plasma guiding structure are physically separate structures.

26. The plasma processing apparatus of claim 1 wherein the plasma guiding structure is positioned to improve delivery of atomic hydrogen to a surface of the workpiece.

27. A plasma processing apparatus comprising:
   a) a toroidal-shape plasma vessel comprising a process chamber;
   b) a magnetic core surrounding a portion of the toroidal-shape plasma vessel;
   c) an RF power supply having an output that is electrically connected to the magnetic core, the RF power supply energizing the magnetic core, thereby forming a toroidal plasma loop discharge in the toroidal-shape plasma vessel; and
   d) a workpiece holder comprising a first and second section each comprising at least one face being shaped and dimensioned so as to constrain a section of a plasma in the toroidal plasma loop discharge to travel substantially perpendicular to a normal surface of the at least one face of the first and second sections.

28. The plasma processing apparatus of claim 27 wherein the first section of the workpiece holder comprises a first half of the workpiece holder and the second section of the workpiece holder comprises a second half of the workpiece holder.

29. The plasma processing apparatus of claim 27 wherein the first section of the workpiece holder is formed of a first material and the second section is formed of a second material that is different from the first material.

30. The plasma processing apparatus of claim 28 wherein at least one of the first and second sections of the workpiece holder is formed of a refractory metal.

31. The plasma processing apparatus of claim 27 wherein the first and second sections of the workpiece holder are formed in a generally cylindrical shape.

32. The plasma processing apparatus of claim 27 wherein the first and second sections of the workpiece holder are formed in a generally hexagonal shape.

33. The plasma processing apparatus of claim 27 wherein the first and second sections of the workpiece holder are formed in a shape and dimensioned so that surfaces exposed to the plasma are approximately equidistant from a center-line of the plasma.

34. The plasma processing apparatus of claim 27 wherein a distance from a center line of the plasma to the at least one face of the first and second sections of the workpiece holder is approximately between 0.5 cm and 2.5 cm.

35. The plasma processing apparatus of claim 27 wherein a distance from a center line of the plasma to the at least one face of the first and second sections of the workpiece holder is approximately 1.0 cm.

36. The plasma processing apparatus of claim 27 wherein the workpiece holder comprises a recessed portion for supporting a workpiece for plasma processing.

37. The plasma processing apparatus of claim 27 wherein the at least one face on the first and second sections of the workpiece holder comprises at least one flat face.

38. The plasma processing apparatus of claim 27 wherein the at least one face of the first and second sections of the workpiece holder comprises at least one rounded face.

39. The plasma processing apparatus of claim 27 wherein the at least one face of the first and second sections of the workpiece holder comprises at least one tubular-shaped face.

40. The plasma processing apparatus of claim 27 wherein the workpiece holder further comprises at least one gas introduction aperture on at least one of the first and the second sections.

41. The plasma processing apparatus of claim 40 wherein at least some of the gas introduction apertures are positioned proximate to recesses on the surface of the workpiece holder.

42. The plasma processing apparatus of claim 27 further comprising a high temperature spacing shim positioned between the first and second sections of the workpiece holder.

43. The plasma processing apparatus of claim 27 further comprising a second magnetic core surrounding the toroidal-shape plasma vessel.

44. The plasma processing apparatus of claim 43 wherein the RF power supply has a second output that is electrically connected to the second magnetic core.

45. The plasma processing apparatus of claim 43 further comprising a second RF power supply having an output that is electrically connected to the second magnetic core, the second RF power supply energizing the second magnetic core.

46. A method for growing single-crystal diamond material, the method comprising:
   a) providing a toroidal-shape plasma vessel comprising a process chamber;
   b) positioning a magnetic core surrounding a portion of the toroidal-shape plasma vessel;

c) energizing the magnetic core with RF radiation, thereby forming a toroidal plasma loop discharge in the toroidal-shape plasma vessel;
d) providing a workpiece holder comprising at least one face that supports a workpiece during growth;
e) providing a plasma guiding structure being shaped and dimensioned so as to constrain a section of a plasma in the toroidal plasma loop to travel substantially perpendicular to a normal to the at least one face that support the workpiece during growth; and
f) growing single-crystal diamond material on the workpiece.

47. The method of claim 46 further comprising translating the workpiece holder during growth.

48. The method of claim 47 wherein a rate of the translating the workpiece holder during growth is approximately equal to a growth rate of the single-crystal diamond material.

49. The method of claim 46 further comprising translating the workpiece holder so that a growing surface on the workpiece is at substantially the same position during the growth.

50. The method of claim 46 further comprising introducing process gasses in the process chamber in at least one position.

51. The method of claim 50 wherein the at least one position is chosen to improve deposition conditions.

52. The method of claim 50 wherein the at least one position is chosen to reduce undesirable deposits on walls of the process chamber.

53. The method of claim 46 further comprising positioning a cooling element adjacent to the workpiece holder to control a temperature of the workpiece to a desired operating temperature.

54. The method of claim 46 wherein the growing the single-crystal diamond material on the workpiece comprises growing the single-crystal diamond material to dimensions that are greater than 1.5 centimeters.

* * * * *